United States Patent
Meguro (10) Patent No.: US 7,986,030 B2
(45) Date of Patent: Jul. 26, 2011

(54) NITRIDE SEMICONDUCTOR SUBSTRATE (75) Inventor: Takeshi Meguro, Kitaibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 242 days.

(21) Appl. No.: 12/379,588

(22) Filed: Feb. 25, 2009

(65) Prior Publication Data

US 2010/0084745 A1 Apr. 8, 2010

(30) Foreign Application Priority Data

Oct. 6, 2008 (JP) .................................. 2008-259720

(51) Int. Cl.
*H01L 29/06* (2006.01)
(52) U.S. Cl. ................ 257/618; 257/615; 257/E29.089; 257/E21.237; 257/E23.179
(58) Field of Classification Search ........... 257/E33.074, 257/618, 615, E29.089, E21.237, 797, E23.179
See application file for complete search history.

(56) References Cited

U.S. PATENT DOCUMENTS

| 5,187,118 | A | * | 2/1993 | Ohmori et al. ................ 438/618 |
| 6,998,700 | B2 | * | 2/2006 | Toba et al. .................... 257/627 |
| 7,195,545 | B2 | | 3/2007 | Nakayama et al. |
| 2004/0129940 | A1 | * | 7/2004 | Iwase et al. ..................... 257/48 |
| 2004/0195658 | A1 | * | 10/2004 | Nakayama et al. ........... 257/618 |
| 2006/0194520 | A1 | | 8/2006 | Nakayama et al. |
| 2010/0270649 | A1 | * | 10/2010 | Ishibashi et al. .............. 257/615 |

FOREIGN PATENT DOCUMENTS

JP 2004-319951 11/2004

* cited by examiner

*Primary Examiner* — Zandra Smith
*Assistant Examiner* — Paul E Patton
(74) *Attorney, Agent, or Firm* — McGinn IP Law Group, PLLC

(57) ABSTRACT

A nitride semiconductor substrate has a first surface forming a principal surface of the substrate. A first edge is formed by beveling at least a portion of an edge of the first surface of the substrate. A scattering region is formed in at least a portion of the first edge. The scattering region scatters more external incident light than the first surface.

20 Claims, 7 Drawing Sheets

NITRIDE SEMICONDUCTOR SUBSTRATE

The present application is based on Japanese patent application No. 2008-259720 filed Oct. 6, 2008, the entire contents of which are incorporated herein by reference.

BACKGROUND OF THE INVENTION

1. Field of the Invention

The present invention relates to a nitride semiconductor substrate. In particular, it relates to a nitride semiconductor substrate with a beveled edge.

2. Description of the Related Art

A conventional nitride semiconductor substrate is known that has a surface roughness Ra of 10 nm to 5 µm at an edge of a gallium nitride (GaN) substrate being circular viewed from its top.

The edge of the nitride semiconductor substrate is smoothed to thereby reduce the incidence of cracking, and enhance electronic device yields in an electronic device manufacturing process using that nitride semiconductor substrate.

The related art to the invention is, e.g., JP-A-2004-319951.

However, when forming on that nitride semiconductor substrate a micro-pattern using a photo mask with a stepper or a mask aligner in the electronic device manufacturing process, using the edge as a reference point for micro-pattern positioning may make it impossible to clearly observe the boundary between the substrate surface and edge under a microscope, and to precisely align the nitride semiconductor substrate relative to the photo mask.

SUMMARY OF THE INVENTION

Accordingly, it is an object of the present invention to provide a nitride semiconductor substrate capable of facilitating alignment in an electronic device manufacturing process.

According to one embodiment of the invention, a nitride semiconductor substrate comprises:

a first surface forming a principal surface of the substrate;

a first edge formed by beveling at least a portion of an edge of the first surface of the substrate; and a scattering region formed in at least a portion of the first edge, the scattering region scattering more external incident light than the first surface.

In the above embodiment, the following modifications and changes can be made.

(i) The nitride semiconductor substrate further comprises $In_xAl_yGa_zN$ ($0 \leq x<1$, $0 \leq y<1$, $0 \leq z<1$, $x+y+z=1$), wherein a surface roughness of the first surface is not less than 0.1 nm and not more than 5 nm, and a surface roughness of the scattering region is not less than 0.1 µm and not more than 10 µm.

(ii) The nitride semiconductor substrate further comprises a second surface forming an opposite principal surface of the substrate to the first surface, a second edge formed by beveling an edge of the second surface of the substrate, and a boundary between the second edge and the second surface, the boundary positioned in an area directly below the scattering region when viewed from the first surface side.

(iii) The nitride semiconductor substrate further comprises an orientation flat formed therein.

(iv) The nitride semiconductor substrate further comprises an index flat formed therein.

(v) The scattering region is formed at least in a portion of the orientation flat.

(vi) The scattering region is formed at least in a portion of the index flat.

(vii) The scattering region has a transmittance of not more than 88% to not less than 400 nm and not more than 780 nm wavelength visible light.

Advantages

According to the nitride semiconductor substrate of the embodiment in the invention, it is possible to provide a nitride semiconductor substrate capable of facilitating alignment in an electronic device manufacturing process.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figures 1A, 1B:
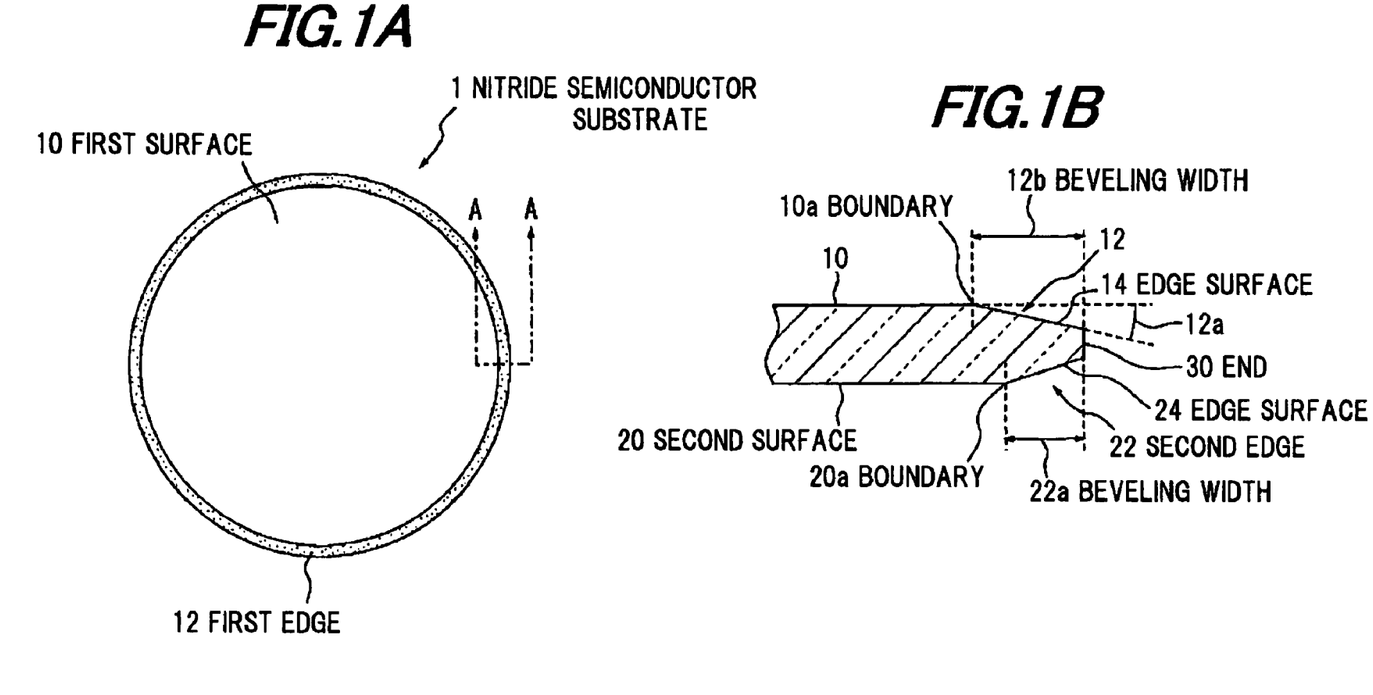
FIG. 1A is a top view illustrating a nitride semiconductor substrate in a first embodiment according to the present invention.
FIG. 1B is an A-A cross-sectional view of FIG. 1A.

FIG. 1A is a schematic top view illustrating a nitride semiconductor substrate in a first embodiment according to the present invention, and FIG. 1B is a schematic A-A cross-sectional view of FIG. 1A.

Nitride Semiconductor Substrate 1 Construction

Nitride semiconductor substrate 1 in the first embodiment has a first surface 10 as its principal surface and a second surface 20 as its opposite principal surface to the first surface 10. And an edge of the first surface 10 is formed with a first edge 12. Likewise an edge of the second surface 20 is formed with a second edge 22. The first edge 12 is formed by beveling at least a portion of the edge of the first surface 10. Likewise the second edge 22 is formed by beveling at least a portion of the edge of the second surface 20. As the beveling, there are "C-beveling" and "R-beveling." The "C-beveling" refers to processing an edge into a flat shape. The "R-beveling" refers to processing an edge into a rounded shape. As one example, the first edge 12 is formed by C-beveling the entire edge of the first surface 10, and the second edge 22 is formed by C-beveling the entire edge of the second surface 20. Further, the nitride semiconductor substrate 1 in the first embodiment is formed of $In_xAl_yGa_zN$ ($0 \leq x<1$, $0 \leq y<1$, $0<z \leq 1$, $x+y+z=1$) as the nitride semiconductor.

First and Second Edges 12 and 22

Referring to FIG. 1B, the first edge 12 includes an edge surface 14 formed to have beveling width 12b from an end 30 of the nitride semiconductor substrate 1 to the middle thereof, and the edge surface 14 is formed sloping at an edge angle 12a to the first surface 10. Also, the second edge 22 includes an edge surface 24 formed to have beveling width 22a from the end 30 of the nitride semiconductor substrate 1 to the middle thereof, and the edge surface 24 is formed sloping at a specified angle to the second surface 20. Further, the end 30 in the first embodiment is formed to orient the surface of the end 30 parallel to a normal to the first and second surfaces 10 and 20.

Here, in this embodiment, the beveling width 12b is formed greater than the beveling width 22a. This allows boundary 20a to be positioned between the second edge 22 and the second surface 20 in an area directly below the first edge 12 when viewed from the first surface 10 side. In other words, boundary 10a between the first edge 12 and the first surface 10 is positioned inward relative to the boundary 20a between the second edge 22 and the second surface 20. That is, in this embodiment, when observing the first surface 10 under a microscope, the boundaries 10a and 20a are provided at a position where the boundary 20a is hidden by the edge surface 14.

Also, the first surface 10 is formed to have a surface roughness (arithmetic average roughness Ra) of not less than 0.1 nm and not more than 5 nm, and the first edge 12 is formed to have a surface roughness (arithmetic average roughness Ra) of not less than 0.1 μm and not more than 10 μm. Also, the edge angle 12a is formed in a range that makes the boundary 10a visible under a microscope, and as one example, is formed in the range of not less than 10° and not more than 80°. Further, the beveling width 12b is not less than 0.1 mm both to inhibit the cracking and chipping of the nitride semiconductor substrate 1 and to ensure the visibility of the boundary 10a. Also, the beveling width 22a is not less than 0.1 mm to inhibit the cracking and chipping of the nitride semiconductor substrate 1. It should be noted, however, that the beveling width 22a is formed narrower than the beveling width 12b, as explained above.

Also, the first edge 12 scatters more external incident light than the first surface 10 and thereby exhibits a frosted glass-like state. That is, the edge surface 14 of the first edge 12 in this embodiment serves as a region to scatter more external light than the first surface 10. Specifically, the first edge 12 is formed to have a transmittance of not more than 88% to visible light with a wavelength of not less than 400 nm and not more than 780 nm, and thereby exhibits a frosted glass-like state. Further, in this embodiment, the "frosted glass-like state" refers to a state in which the transmittance of the first edge 12 to visible light is not more than 88%, and the frosted glass-like region is referred to as a "scattering region."

Nitride Semiconductor Substrate 1 Production Method

The nitride semiconductor substrate 1 in this embodiment may be produced by fabricating a freestanding substrate formed of a nitride semiconductor, subsequently mirror-finishing both the front and back sides of the freestanding substrate fabricated, and beveling (C-beveling or R-beveling) edges of both the mirror-finished front and back surfaces. Specifically, the nitride semiconductor substrate 1 is produced by performing the following steps.

Freestanding Substrate Preparation Step

First, preprocessing is performed on a sapphire substrate as a hetero-substrate by using ELO (Epitaxial Lateral Overgrowth) etc., and thick nitride semiconductor film is then formed thereon by HVPE (Hydride Vapor Phase Epitaxy). Next, the sapphire substrate is removed by mechanical grinding or laser liftoff. This results in a freestanding substrate formed of the nitride semiconductor.

Grinding Step

This is followed by grinding both sides of the substrate obtained. The grinding is performed by grinding or lapping both sides of the substrate (using GC#800 or the like), to flatten both the surfaces thereof, followed by polishing both the flattened surfaces to thereby mirror-finish them. In this grinding, the surface roughness of the gallium polarity face that is the substrate surface (e.g., the first surface 10) is not more than 5 nm.

Profiling and Beveling Steps

This is followed by profiling the substrate into a specified shape. For example, the substrate is profiled into a circular shape with a specified diameter. This is followed by peripheral edge C-beveling. The C-beveling is performed using a beveling machine. The beveling conditions are set by adjusting a grindstone, pressurization, delivery speed, etc. such that the surface roughness (Ra) of the edge surface 14 is not less than 0.1 μm and not more than 10 μm, and the edge surface 14 has a transmittance of not more than 88% to visible light with a wavelength of not less than 400 nm and not more than 780 nm. Here, since the first surface 10 has a transmittance of nearly 100% to visible light passing therethrough, the difference in transmittance between the first surface 10 and the edge surface 14 is not less than 12%.

The above steps result in the nitride semiconductor substrate 1 in this embodiment. Further, it is verified whether or not the transmittance of the edge surface 14 to visible light is not more than 88%, for example, by preparing a nitride semiconductor substrate for reference, processing the first surface 10 of the reference nitride semiconductor substrate in the same manner as the case of forming the first edge 12 of the nitride semiconductor substrate 1 in this embodiment, and measuring the transmittance of the edge surface 14 to visible light with a visible light absorption spectrum instrument.

Advantages of the First Embodiment

The nitride semiconductor substrate 1 in this embodiment has first edge 12 at the edge of first surface 10, and processes the surface of the first edge 12, i.e., the edge surface 14 into a surface scattering more external visible light than the first surface 10, thereby permitting clear identification of boundary 10a between the first edge 12 and the first surface 10 under a microscope. This allows facilitating the focusing of the microscope to that boundary 10a when forming a micro pattern on the nitride semiconductor substrate using photolithography in an electronic device manufacturing process. Accordingly, alignment can be done only by focusing the microscope to the boundary between the edge and the substrate surface, even without focusing to each of the periphery of the beveled substrate and the pattern formed on the substrate (e.g., a mask pattern formed by photoresist), and it is therefore possible to save focusing time and enhance alignment accuracy.

Also, as mentioned above, the nitride semiconductor substrate 1 in this embodiment permits clear identification of the boundary between the edge and the substrate surface under a microscope, and therefore enhancement in accuracy of micro-processing on the nitride semiconductor substrate 1 using a stepper or a mask aligner. Accordingly, the nitride semiconductor substrate 1 in this embodiment permits enhancement in device properties and yields of electronic devices fabricated from that nitride semiconductor substrate 1.

Further, since the nitride semiconductor substrate 1 in this embodiment has a surface roughness of not less than 0.1 μm and not more than 10 μm at the edge surface 14 and is in a frosted glass-like state, the visibility of the boundary 10a can be enhanced, and in the manufacturing process using the nitride semiconductor substrate 1, substrate cracking can be reduced. Further, comparison of nitride semiconductor substrate 1 having an edge surface 14 roughness of not less than 0.1 μm and not more than 10 μm and a nitride semiconductor substrate having a surface roughness of 20 μm produced according to this embodiment, has shown that defective cracking of the nitride semiconductor substrate 1 in this embodiment is reduced by half compared to the nitride semiconductor substrate having a surface roughness of 20 μm.

Further, the nitride semiconductor substrate 1 in this embodiment may be used in a deep ultraviolet, ultraviolet, blue violet, blue, or green light-emitting diode (LED), or a white LED with a fluorescent material such as a YAG combined with these LEDs, or a deep ultraviolet, ultraviolet, blue violet, blue, or green laser diode (LD).

Modifications to the First Embodiment

Figure 2A:
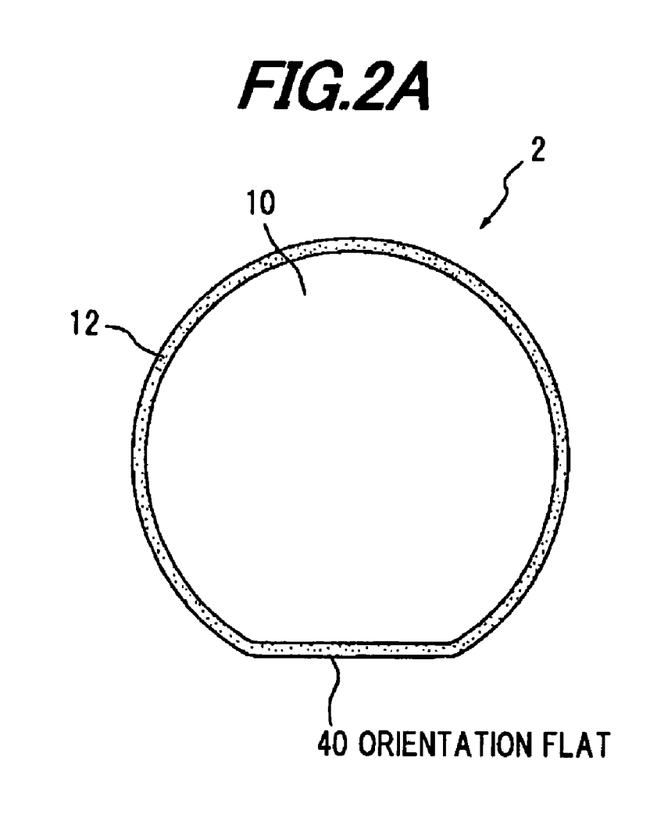
FIG. 2A is a top view illustrating a nitride semiconductor substrate in a modification to the first embodiment according to the present invention.
Figure 2B:
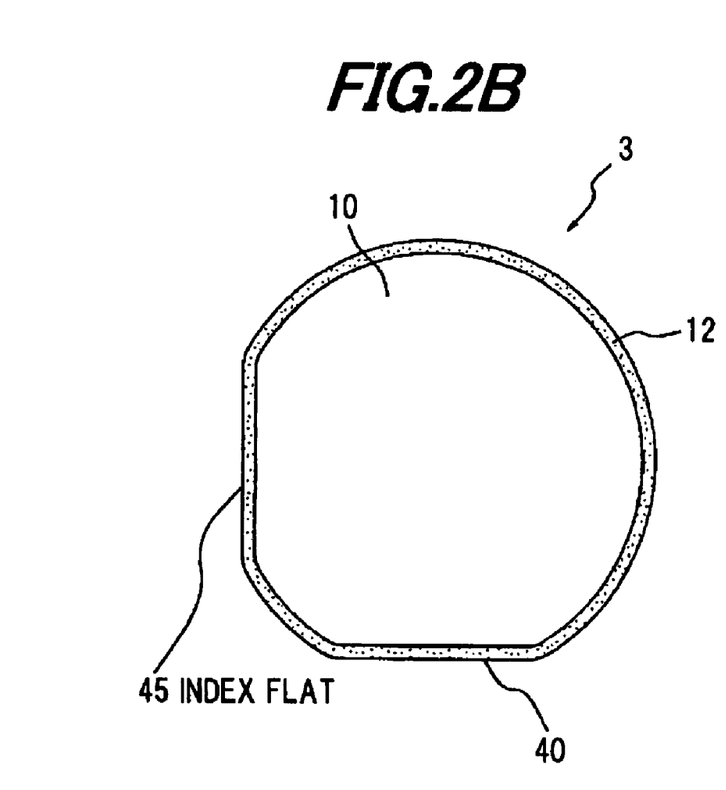
FIG. 2B is a top view illustrating a nitride semiconductor substrate in another modification to the first embodiment according to the present invention.

FIG. 2A is a schematic top view illustrating a nitride semiconductor substrate in a modification to the first embodiment according to the present invention, and FIG. 2B is a schematic top view illustrating a nitride semiconductor substrate in another modification to the first embodiment according to the present invention.

Nitride semiconductor substrates 2 and 3 in modification to the first embodiment have substantially the same construction as nitride semiconductor substrate 1 of the first embodiment, except that the have a different substrate peripheral shape. Thus, the details thereof will be omitted below except that difference.

Referring to FIG. 2A, nitride semiconductor substrate 2 is formed with an orientation flat 40 in a portion of first edge 12 which indicates substrate face orientation. In the nitride semiconductor substrate 2, the entire first edge 12 including the orientation flat 40 (specifically the orientation flat 40, first edge 12 and their respective edge surfaces 14) serves as a scattering region.

Referring to FIG. 2B, nitride semiconductor substrate 3 is formed with an index flat 45 in a portion of first edge 12, which identifies first and second surfaces 10 and 20, in addition to orientation flat 40. The longitudinal direction of the orientation flat 40 and the longitudinal direction of the index flat 45 are formed perpendicular to each other. In the nitride semiconductor substrate 3, the entire first edge 12 including the orientation flat 40 and the index flat 45 (specifically the orientation flat 40, index flat 45, first edge 12 and their respective edge surfaces 14) serves as a scattering region.

Second Embodiment

Figure 3A:
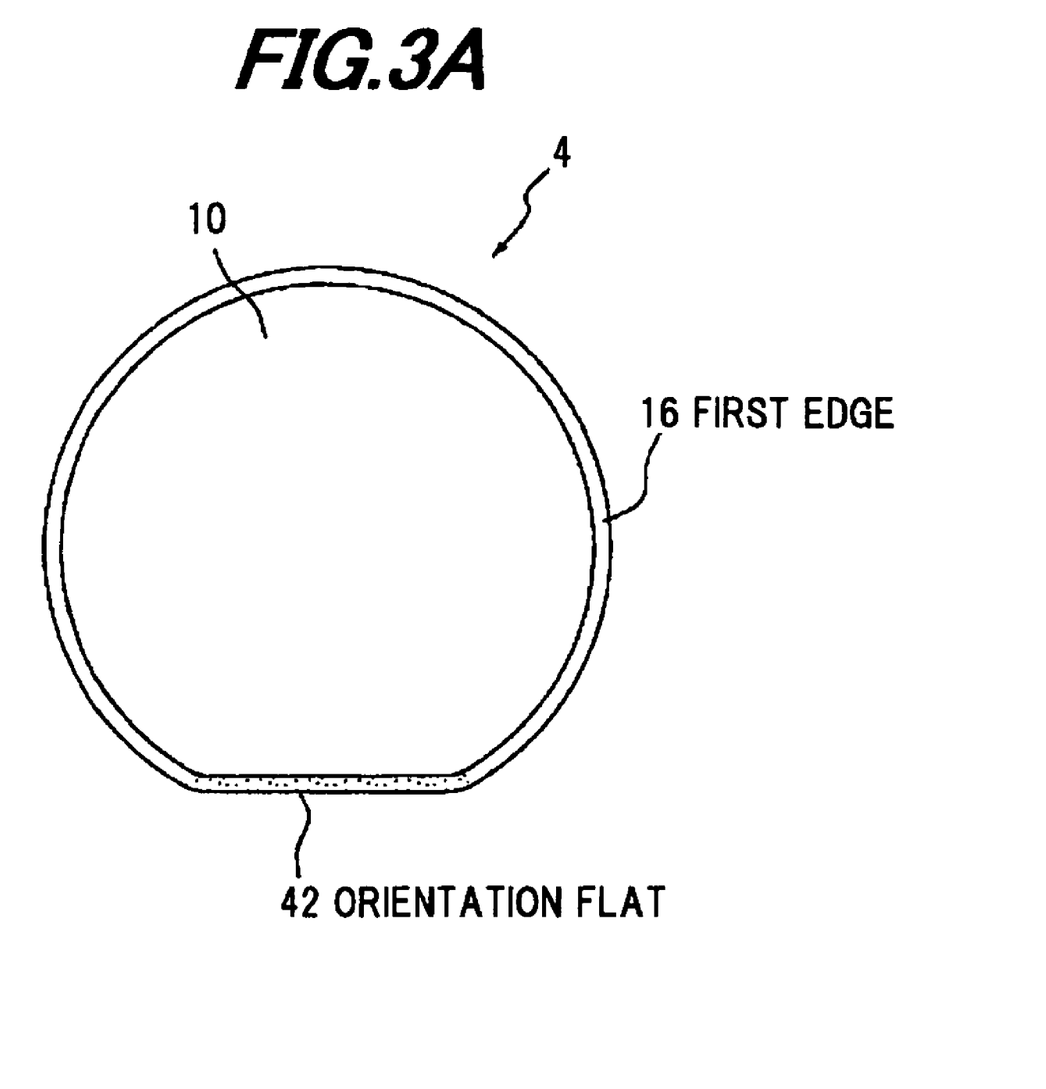
FIG. 3A is a top view illustrating a nitride semiconductor substrate in a second embodiment according to the present invention.

FIG. 3A is a schematic top view illustrating a nitride semiconductor substrate in a second embodiment according to the present invention.

Nitride semiconductor substrate 4 in the second embodiment is substantially the same in construction as nitride semiconductor substrate 1 of the first embodiment, except that its frosted glass-like portion is different therefrom. Thus, the details thereof are omitted except that difference.

The nitride semiconductor substrate 4 in the second embodiment is provided with a first edge 16 at an edge of a first surface 10, and an orientation flat 42 in a portion of the first edge 16. In this embodiment, the first edge 16 is beveled and partially frosted. In the second embodiment, only the orientation flat 42 surface, which is a C-beveled portion, is formed in a frosted glass-like state. This allows the orientation flat 42 to serve as a scattering region.

The orientation flat 42 is formed as follows. First, in beveling, a peripheral edge is C-beveled, and an orientation flat 42 edge is C-beveled. Next, only a position corresponding to the orientation flat 42 is processed in the conditions that the surface roughness (Ra) of the orientation flat 42 is not less than 0.1 μm and not more than 10 μm, and the transmittance of the edge surface 14 to visible light is not more than 88%. Further, the first edge 16 excluding the orientation flat 42 is formed by beveling in the conditions that its surface roughness (Ra) is not less than 0.1 μm and not more than 10 μm. This allows the orientation flat 42 to scatter more external incident light than the first surface 10.

Modifications to the Second Embodiment

Figure 3B:
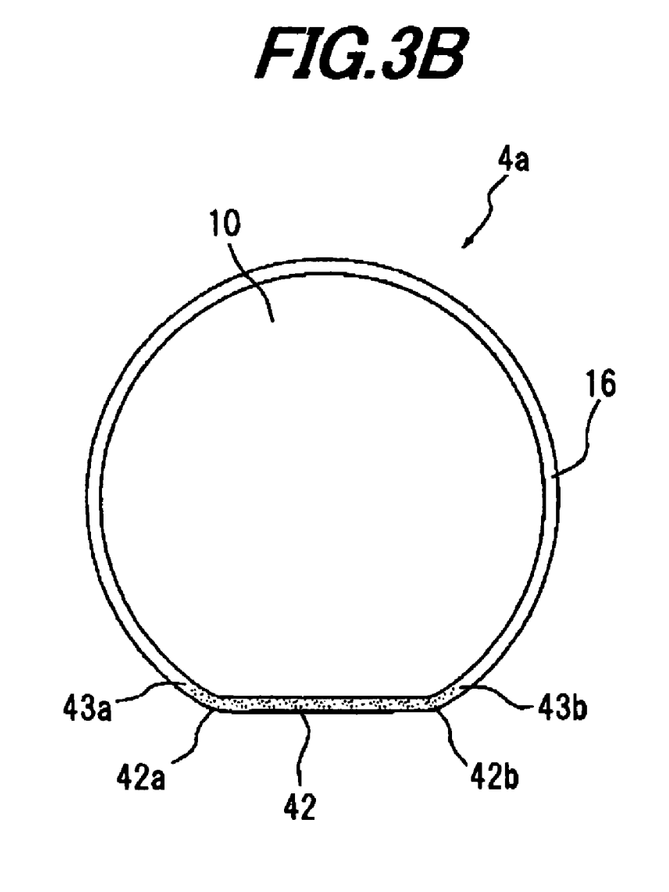
FIG. 3B is a top view illustrating a nitride semiconductor substrate in a modification to the second embodiment according to the present invention.
Figure 3C:
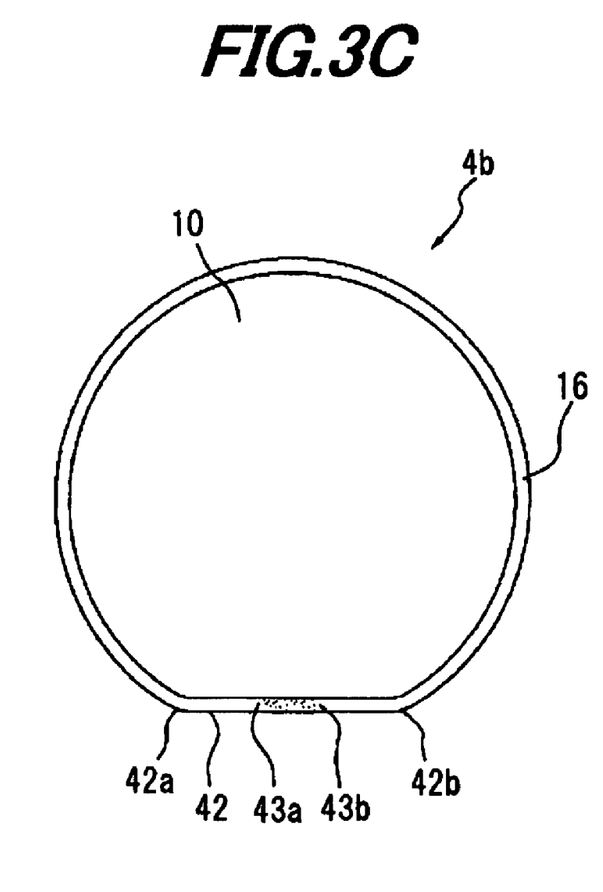
FIG. 3C is a top view illustrating a nitride semiconductor substrate in another modification to the second embodiment according to the present invention.

FIGS. 3B and 3C each are a schematic top view illustrating a nitride semiconductor substrate in a modification to the second embodiment according to the present invention.

Nitride semiconductor substrates 4a and 4b in the modification to the second embodiment have substantially the same construction as nitride semiconductor substrate 4 of the second embodiment, except that they have a different frosted glass-like portion. Thus, the details thereof will be omitted below except that difference.

First, as shown in FIG. 3B, the nitride semiconductor substrate 4a is processed into a frosted glass-like state from an orientation flat 42 and ends 42a and 42b of the orientation flat 42 to a specified distance along a first edge 16. That is, the nitride semiconductor substrate 4a is processed into a frosted glass-like state from the orientation flat 42 to boundaries 43a and 43b between the frosted glass-like beveled region and the unfrosted beveled region, and the region between the boundaries 43a and 43b serves as a scattering region.

Also, as shown in FIG. 3C, the nitride semiconductor substrate 4b is processed into a frosted glass-like state only in a portion of orientation flat 42. Accordingly, in the nitride semiconductor substrate 4b, the frosted glass-like portion width, i.e., the scattering region is formed narrower than the orientation flat 42 width. Further, although in FIG. 3C, the scattering region is formed in the middle portion of the orientation flat 42, the scattering region may be formed to be positioned at an end 42a or 42b side.

Modifications to the Second Embodiment

Figure 4A:
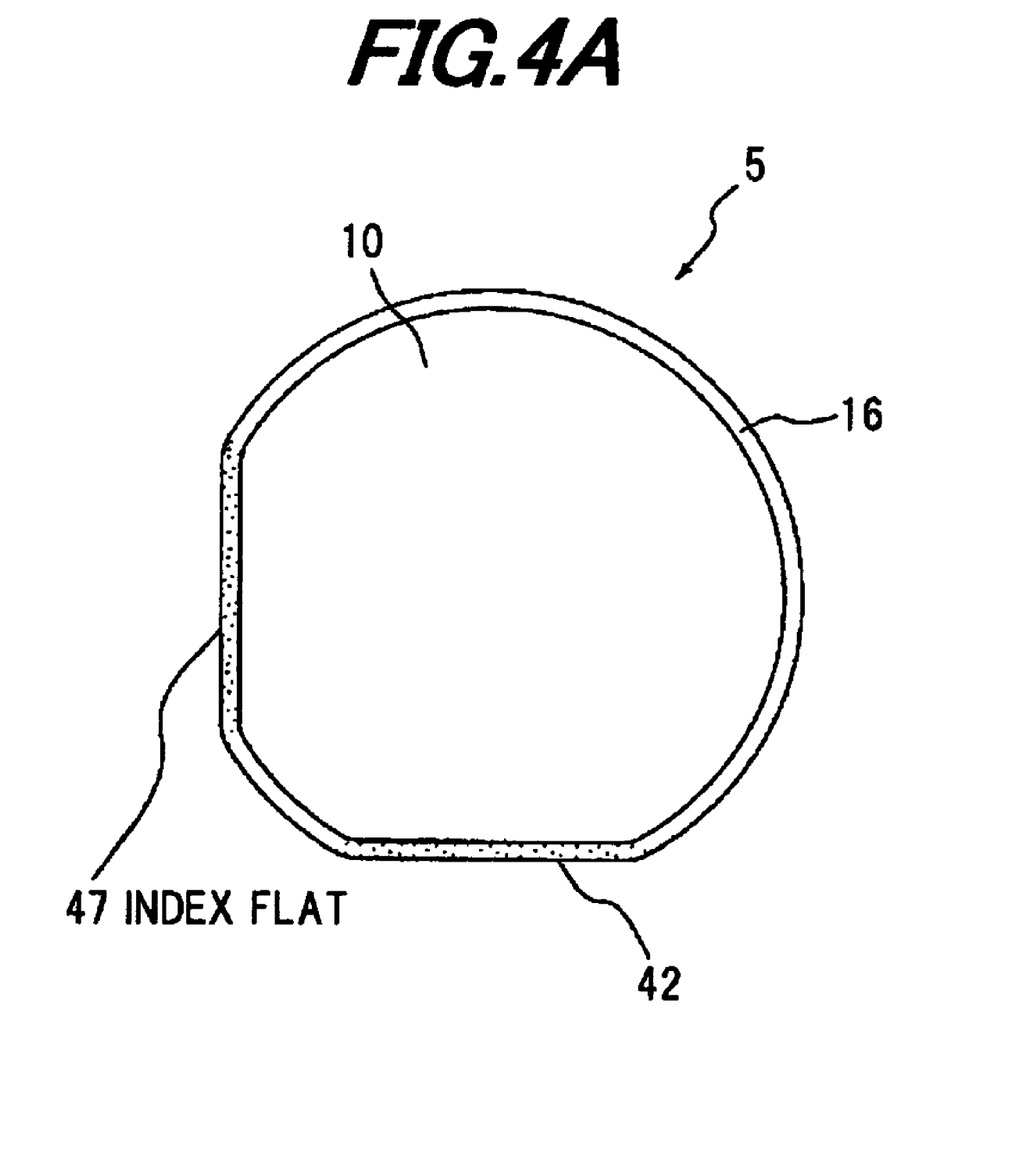
FIG. 4A is a top view illustrating a nitride semiconductor substrate in a modification to the second embodiment according to the present invention.
Figure 4B:
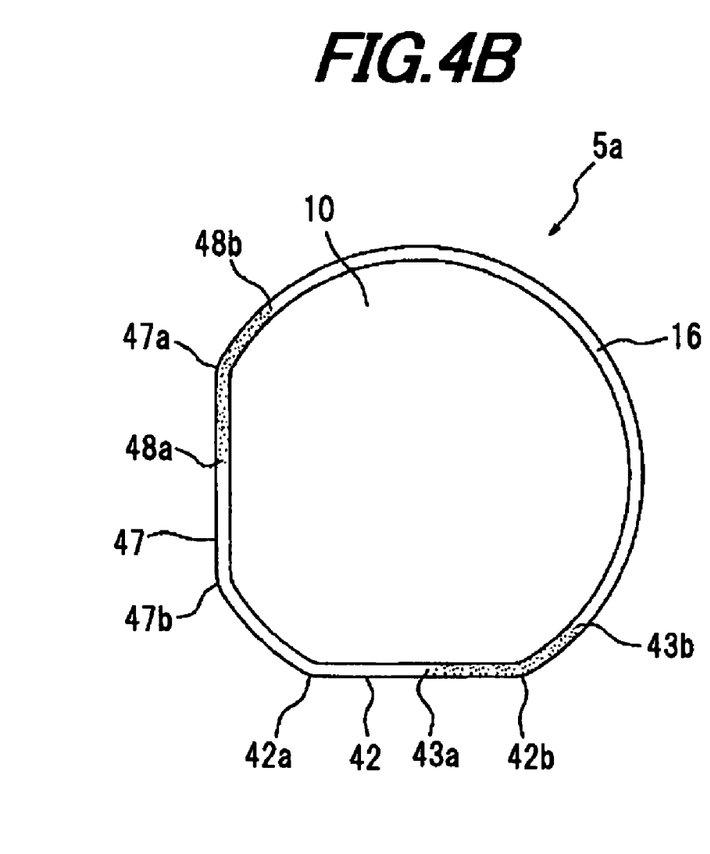
FIG. 4B is a top view illustrating a nitride semiconductor substrate in a modification to the second embodiment according to the present invention.
Figure 4C:
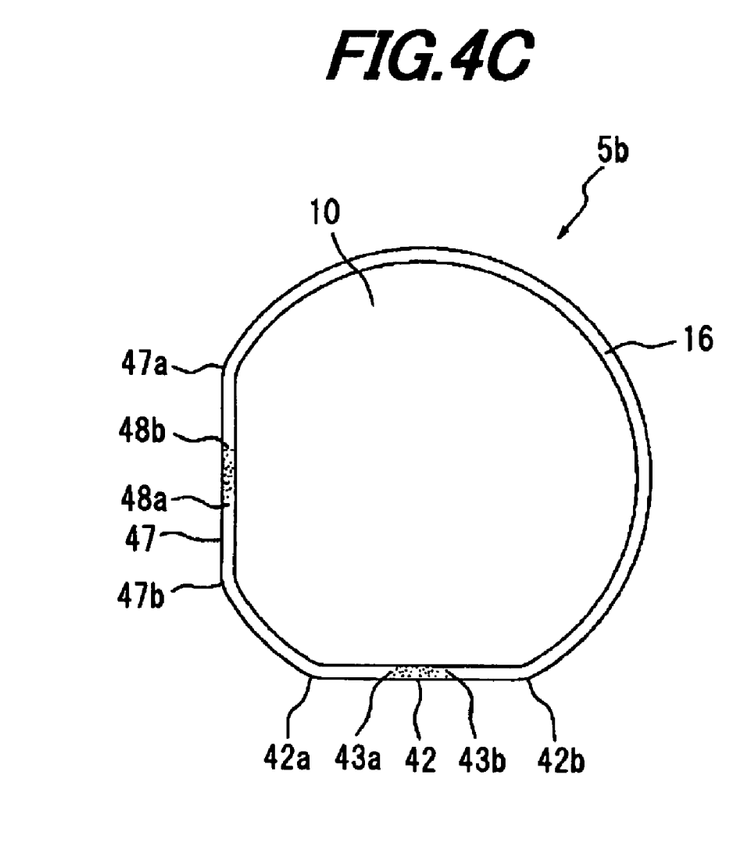
FIG. 4C is a top view illustrating a nitride semiconductor substrate in a modification to the second embodiment according to the present invention.

FIGS. 4A to 4C each are a schematic top view illustrating a nitride semiconductor substrate in a modification to the second embodiment according to the present invention.

Nitride semiconductor substrates 5, 5a and 5b in the modification to the second embodiment have substantially the same construction as nitride semiconductor substrate 4 of the second embodiment, except that they have a different or additional frosted glass-like portion. Thus, the details thereof will be omitted below except that difference.

The nitride semiconductor substrate 5 in the modification to the second embodiment shown in FIG. 4A is provided with a first edge 16 at an edge of a first surface 10, and an orientation flat 42 and an index flat 47 in portions, respectively, of the first edge 16. In the modification to the second embodiment, the first edge 16 is beveled and partially frosted. In this embodiment, only the orientation flat 42 and index flat 47 surfaces are formed in a frosted glass-like state, and serve as scattering regions, respectively.

Also, the nitride semiconductor substrate 5a shown in FIG. 4B is formed with one boundary 43a between the scattering region and non-scattering beveled region in a portion of orientation flat 42, and the other boundary 43b between the scattering region and non-scattering beveled region at a specified distance along first edge 16 from an end 42b of the orientation flat 42.

Likewise, the nitride semiconductor substrate 5a is formed with one boundary 48a between the scattering region and non-scattering beveled region in a portion of index flat 47, and the other boundary 48b between the scattering region and non-scattering beveled region at a specified distance along first edge 16 from an end 47a of the index flat 47.

Also, the nitride semiconductor substrate 5b shown in FIG. 4C is formed with scattering regions in portions of orientation flat 42 and index flat 47, respectively. That is, in a portion of the orientation flat 42 is formed the scattering region which has boundaries 43a and 43b, while in a portion of the index flat 47 is formed the scattering region which has boundaries 48a and 48b. Accordingly, the nitride semiconductor substrate 5b has the scattering region which is formed narrower than the orientation flat 42 width, and the scattering region which is formed narrower than the index flat 47 width.

Third Embodiment

Figure 5A:
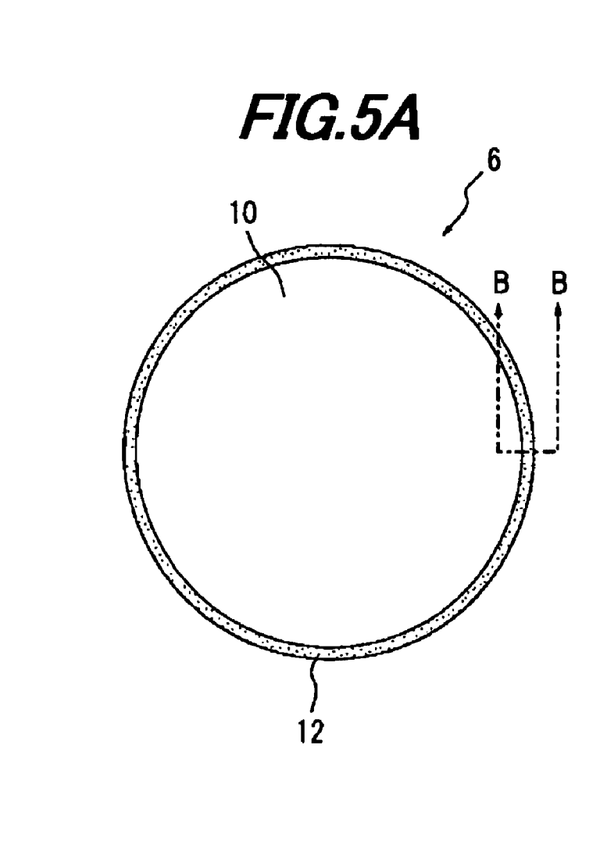
FIG. 5A is a top view illustrating a nitride semiconductor substrate in a third embodiment according to the present invention.
Figure 5B:
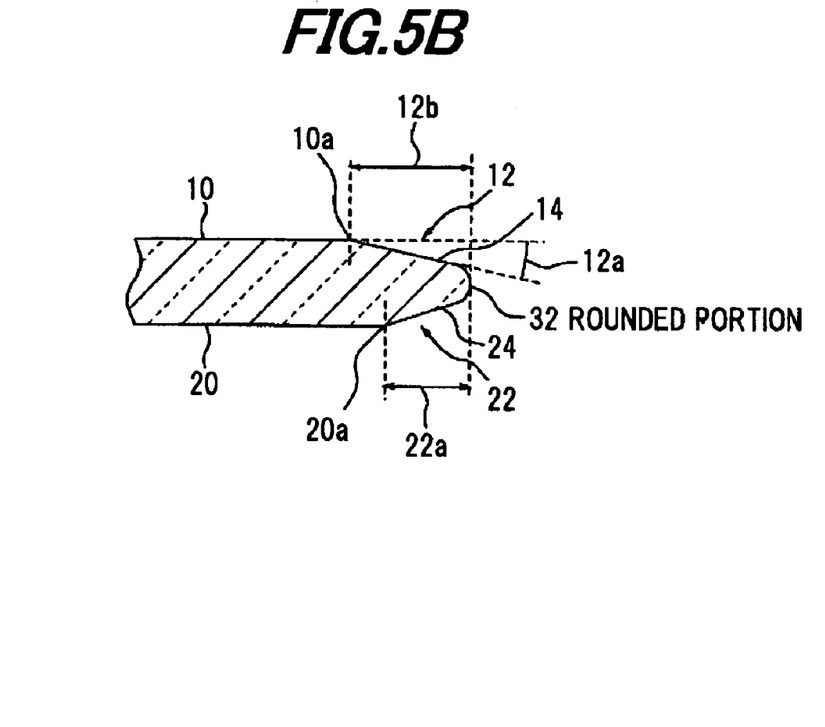
FIG. 5B is a B-B cross-sectional view of FIG. 5A.

FIG. 5A is a schematic top view illustrating a nitride semiconductor substrate in a third embodiment according to the present invention, and FIG. 5B is a schematic B-B cross-sectional view of FIG. 5A.

Nitride semiconductor substrate 6 in the third embodiment is substantially the same in construction as nitride semiconductor substrate 1 of the first embodiment, except that it is different therefrom in substrate peripheral shape. Thus, the details thereof are omitted except that difference.

In the nitride semiconductor substrate 6, the outermost peripheral portions of first and second edges 12 and 22 are continuous to each other with rounded portion 32. In the nitride semiconductor substrate 6, the further rounding of the outermost peripheral portions of the substrate edges permits inhibition of substrate cracking or chipping due to the ends of the first and second edges 12 and 22.

Although the invention has been described with respect to the specific embodiments above, the appended claims are not to be limited thereto. Also, it should be noted that not all of combinations of the features described in the embodiments are essential to means for solving the problems of the invention.

What is claimed is:

1. A nitride semiconductor substrate, comprising:
a first surface forming a principal surface of the substrate;
a first edge formed by beveling at least a portion of an edge of the first surface of the substrate; and
a scattering region formed in at least a portion of the first edge, the scattering region scattering more external incident light than the first surface,
wherein a boundary is formed between the first surface and the scattering region due to a difference between a surface roughness of the first surface and a surface roughness of the scattering region.

2. The nitride semiconductor substrate according to claim 1, further comprising:

wherein the surface roughness of the first surface is not less than 0.1 nm and not more than 5 nm, and the surface roughness of the scattering region is not less than 0.1 μm and not more than 10 μm.

3. The nitride semiconductor substrate according to claim 2, further comprising:
a second surface forming an opposite principal surface of the substrate to the first surface;
a second edge formed by beveling an edge of the second surface of the substrate; and
a second boundary between the second edge and the second surface, the second boundary being positioned in an area directly below the scattering region when viewed from the first surface side.

4. The nitride semiconductor substrate according to claim 3, further comprising:
an orientation flat formed therein.

5. The nitride semiconductor substrate according to claim 4, further comprising:
an index flat formed therein.

6. The nitride semiconductor substrate according to claim 5, wherein the scattering region is formed at least in a portion of the orientation flat.

7. The nitride semiconductor substrate according to claim 5, wherein the scattering region is formed at least in a portion of the index flat.

8. The nitride semiconductor substrate according to claim 3, wherein the scattering region has a transmittance of not more than 88% to not less than 400 nm and not more than 780 nm wavelength visible light.

9. The nitride semiconductor substrate according to claim 1, wherein the scattering region has a transmittance of not more than 88% to not less than 400 nm and not more than 780 nm wavelength visible light.

10. The nitride semiconductor substrate according to claim 2, wherein the scattering region has a transmittance of not more than 88% to not less than 400 nm and not more than 780 nm wavelength visible light.

11. The nitride semiconductor substrate according to claim 1, wherein the first edge is formed by C-beveling an entire edge of the first surface.

12. The nitride semiconductor substrate according to claim 3, wherein the second edge is formed by C-beveling an entire edge of the second surface.

13. The nitride semiconductor substrate according to claim 1, wherein an edge angle of the first edge is formed within a range of not less than 10 degrees and not more than 80 degrees.

14. The nitride semiconductor substrate according to claim 1, wherein a beveling width of the first edge is not less than 0.1 mm.

15. The nitride semiconductor substrate according to claim 6, wherein the scattering region is formed only in a portion of the orientation flat.

16. The nitride semiconductor substrate according to claim 1, wherein an outermost peripheral portion of the first edge is rounded.

17. The nitride semiconductor substrate according to claim 3, wherein an outermost peripheral portion of the second edge is rounded.

18. The nitride semiconductor substrate according to claim 1, wherein the difference between the surface roughness of the first surface and the surface roughness of the scattering region is 95 nm or more.

19. The nitride semiconductor substrate according to claim 1, further comprising:
- a second surface forming an opposite principal surface of the substrate to the first surface;
- a second edge formed by beveling an edge of the second surface of the substrate; and
- a second boundary between the second edge and the second surface,
- wherein the first boundary is positioned inward relative to the second boundary.

20. The nitride semiconductor substrate according to claim 1, further comprising:
- a second surface forming an opposite principal surface of the substrate to the first surface;
- a second edge formed by beveling an edge of the second surface of the substrate; and
- a second boundary between the second edge and the second surface,
- wherein a beveling width from an end of the semiconductor substrate to the first boundary is greater than a beveling width from the end of the semiconductor substrate to the second boundary.

* * * * *